(12) United States Patent
Das et al.

(10) Patent No.: US 10,491,228 B2
(45) Date of Patent: Nov. 26, 2019

(54) DIGITAL MODULATOR ENTROPY SOURCE

(71) Applicant: TEXAS INSTRUMENTS INCORPORATED, Dallas, TX (US)

(72) Inventors: Abhijit Kumar Das, Plano, TX (US); Brian Roger Elies, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/691,827

(22) Filed: Aug. 31, 2017

(65) Prior Publication Data

US 2018/0123607 A1 May 3, 2018

Related U.S. Application Data

(63) Continuation of application No. 15/339,931, filed on Nov. 1, 2016, now Pat. No. 9,780,798.

(51) Int. Cl.
*H03M 1/00* (2006.01)
*G06F 7/58* (2006.01)
*H03M 1/48* (2006.01)
*H03M 1/12* (2006.01)

(52) U.S. Cl.
CPC ............ *H03M 1/001* (2013.01); *G06F 7/588* (2013.01); *H03M 1/48* (2013.01); *H03M 1/00* (2013.01); *H03M 1/12* (2013.01)

(58) Field of Classification Search
CPC .................................. H03M 1/00; H03M 1/12

USPC .......................... 341/110, 120, 122, 155, 156
See application file for complete search history.

(56) References Cited

U.S. PATENT DOCUMENTS

| | | |
|---|---|---|
| 6,218,973 B1 | 4/2001 | Barrett, Jr. et al. |
| 9,054,731 B2* | 6/2015 | Alldred ................. H03M 3/442 |
| 2008/0104156 A1 | 5/2008 | Macaulay et al. |
| 2012/0038500 A1* | 2/2012 | Dijkmans ............. H03M 3/434 341/143 |
| 2012/0185692 A1* | 7/2012 | Hamlin ................. H04L 9/3231 713/155 |
| 2015/0109040 A1 | 4/2015 | Yen |

OTHER PUBLICATIONS

International Search Report and Written Opinion, PCT/US2017/059527, dated Feb. 7, 2018 (7 pages).

(Continued)

*Primary Examiner* — Joseph J Lauture
(74) *Attorney, Agent, or Firm* — Ebby Abraham; Charles A. Brill; Frank D. Cimino

(57) ABSTRACT

An electronic circuit system with an input for receiving an analog signal having a frequency and comprising noise, that noise including input referred noise, and the noise fluctuates in a range. The system also comprises a signal path with: (i) an analog to digital converter for providing a digital output value in response to a clock period; (ii) a feedback node; and (iii) circuitry for limiting a signal swing at the feedback node, during a period of the clock period, to be no greater than an RMS value of the noise. The analog to digital converter is further for providing the digital output value in response to the analog signal and the signal swing at the feedback node.

9 Claims, 5 Drawing Sheets

(56) References Cited

OTHER PUBLICATIONS

Callegari, Sergio, et al; Embeddable ADC-Based True Random Number Generator for Cryptographic Applications Exploiting Non-linear Signal Processing and Chaos; IEEE Transactions on Signal Processing, IEEE Service Center. New York, NY, US vil. 53, No. 2, Feb. 1, 2005 (Feb. 1, 2005).

EP Search Report; Application No./Patent No. 178673869.9-1218/ 3535848; PCT/US2017059527; dated Oct. 1, 2019; 7 Pages.

* cited by examiner

DIGITAL MODULATOR ENTROPY SOURCE

CROSS-REFERENCE TO RELATED APPLICATIONS

This continuation application claims priority to U.S. patent application Ser. No. 15/339,931, filed Nov. 1, 2016, which application is incorporated herein by reference in its entirety.

STATEMENT REGARDING FEDERALLY SPONSORED RESEARCH OR DEVELOPMENT

Not Applicable.

BACKGROUND OF THE INVENTION

The preferred embodiments relate to a computation system including a digital entropy signal generation apparatus and method.

In digital or other computational systems, entropy is randomness that may be generated by hardware or software and is typically output in a sequence of random numbers or symbols. Such entropy has various uses, such as in statistical sampling, computer simulation, and securing data from interception or theft, including by cryptography, by ways of example. Cryptography typically includes one or more keys that must be randomly generated, where the keys are used to encrypt data when transmitted and decrypt the encrypted data when received, and the greater the randomness associated with the key(s) the more difficult unauthorized third party decryption (i.e., without the authorized key) becomes. As other cryptography examples, randomness may use used for other inputs, such as for generating digital signatures or challenges in authentication protocols. In all events, in such uses, typically the more true randomness provided by the entropy-creating system, the better the performance of the application relying on that system. Measures of randomness typically determine whether a pattern exists or is discernable in the output sequence of the random generating system. Indeed, the National Institute of Standards and Technology (NIST) includes various publications, tools, and guidance toward developing statistical measures and implementations for detecting and improving the level of randomness in binary sequences.

While the prior art includes various manners of creating random numbers, additional considerations of complexity arise in that many applications now and in the future benefit from having random number generation onboard of a system level processor, such as a microprocessor, digital signal processor (DSP), microcontroller unit (MCU), or other comparable integrated circuit device. For example, design of such devices typically includes considerations of cost in terms of area and power consumed on or by the device, where such considerations may impede or prohibit the use of an integrated random number generator. Moreover, processor clock speed may be incompatible with the clock speeds necessary to generate random numbers according to prior art approaches.

Given the preceding discussion, while the prior art approaches may be acceptable in certain implementations, some applications may have requirements that are not sufficiently addressed by the prior art. Thus, the present inventors seek to improve upon the prior art, as further detailed below.

BRIEF SUMMARY OF THE INVENTION

In a preferred embodiment, there is an electronic circuit system. The system comprises an input for receiving an analog signal comprising a frequency and noise, that noise including input referred noise, and the noise fluctuates in a range. The system also comprises a signal path. The signal path comprises: (i) an analog to digital converter for providing a digital output value in response to a clock period; (ii) a feedback node; and (iii) circuitry for limiting a signal swing at the feedback node, during a period of the clock period, to be no greater than an RMS value of the noise. The analog to digital converter is further for providing the digital output value in response to the analog signal and the signal swing at the feedback node.

Numerous other inventive aspects are also disclosed and claimed.

DETAILED DESCRIPTION OF EMBODIMENTS

Figure 1:
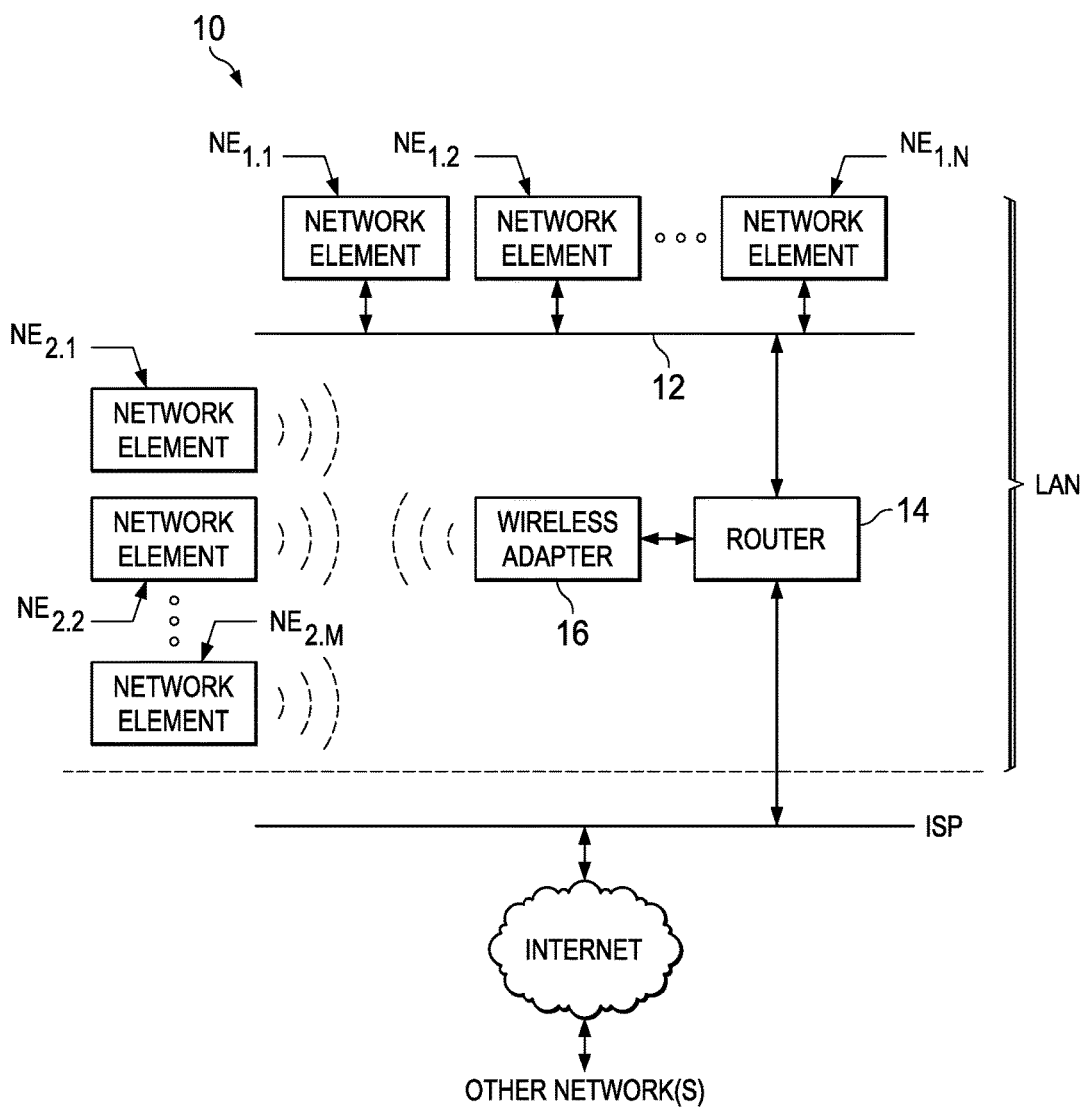
FIG. 1 illustrates an electrical block diagram of a network system 10, according to a preferred embodiment.

FIG. 1 illustrates an electrical block diagram of a network system 10, according to one example of a preferred embodiment. System 10 includes various aspects known in the art that are first described, followed by additional preferred embodiment aspects described in the remainder of this document. System 10 includes a local area network (LAN) shown generally above a horizontal dashed line in the Figure, and the LAN includes a number of well-known items. The LAN also is connected via an Internet Service Provider (ISP) to the Internet, which itself represents and/or is connected to a network of additional networks, including the elements connected to those networks. Returning to the LAN, it has a physical interface 12, such as a multi-conductor cable, to which are connected a number N of network elements shown as $NE_{1.1}$, $NE_{1.2}$, . . . $NE_{1.N}$. Each of these (and other) network elements referred to herein is a logical entity that communicates onto a telecommunication or computing system network; such elements, therefore, may be computers, tablets, personal devices, as well as modules or the like that are anticipated to be prolific in the development of the Internet-of-Things (IoT). Such devices may be constructed of myriad forms of hardware and software (including firmware and the like), with at least the minimal functionality to communicate to another device in the LAN. Further, the network elements may include various other computational or feature functionality. Also connected to physical interface 12 is a router 14, which is further coupled to (or includes) a wireless adapter 16. Wireless adapter 16 is operable to bi-directionally communicate wirelessly with a number M of network elements shown as $NE_{2.1}$, $NE_{2.2}$, ... $NE_{2.M}$. Router 14 controls the forwarding of data packets among the network elements in the LAN as well as between the LAN and the ISP. In all events, any of the network elements of FIG. 1 are operable to communicate with one another, or with what is generally shown as OTHER NETWORK(s)) that have compatible network elements, where such other networks are remotely located but likewise may communicate via the Internet.

Figure 2:
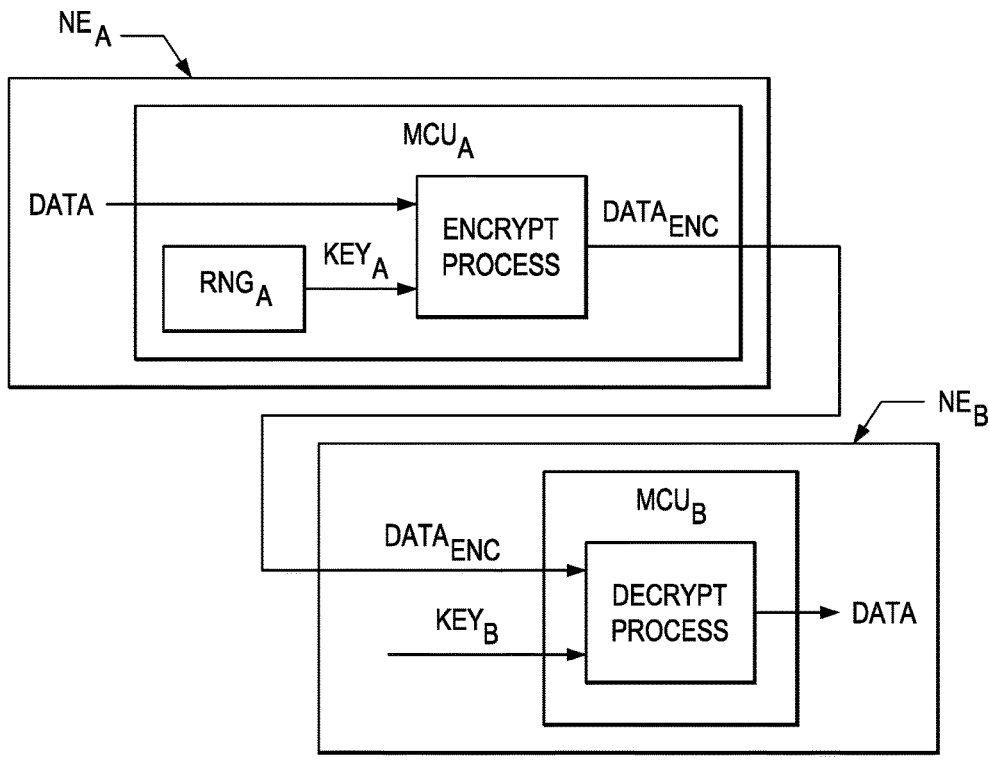
FIG. 2 details two network elements $NE_A$ and $NE_B$ that may be representative of any of the network elements of FIG. 1.

Looking to additional aspects of system 10 as improved as detailed later in connection with the preferred embodiment, one or more, and preferably all, of its network elements $NE_{1.x}$ and $NE_{2.x}$ are further improved with security protocol programming, as may be implemented in either hardware, software, or a combination thereof, so as to reduce the possibility that encrypted frames communicated by those elements may be decrypted by a nefarious third party. In this regard, FIG. 2 further details two network elements $NE_A$ and $NE_B$, which may be representative of any of the network elements of FIG. 1 (or of elements on the OTHER NETWORK(s). Network element $NE_A$ includes a processor (e.g., microcontroller) $MCU_A$, which includes a random number generator $RNG_A$. As detailed later, in a preferred embodiment random number generator $RNG_A$ is operable to provide an entropy based random number, thereby providing, or from which may be determined, an encryption key $KEY_A$. Both $KEY_A$ and DATA are connected to an encryption process also performed as part of processor $MCU_A$. The encryption process may be achieved by any of various techniques known or ascertainable by one skilled in the art, and the result is encrypted data $DATA_{ENC}$. This encrypted data $DATA_{ENC}$ is communicated from network element $NE_A$ to network element $NE_B$, via any of the various communication manners described earlier. The encrypted data $DATA_{ENC}$ is thus received by network element $NE_B$ and processed by its respective processor $MCU_B$, which includes a decryption process that receives the encrypted data $DATA_{ENC}$ and a data decryption key $KEY_B$. Data decryption key $KEY_B$ may be symmetric or asymmetric with respect to the decryption key $KEY_A$ used by network element $NE_A$, with the appropriate protocol or the like establishing the choice so that by design the data is secure when communicated between the network elements, so as to deter or eliminate the possibility of third party unauthorized detection of the original data DATA processed by network element $NE_A$. In all events, note that the level of security as achieved by the encryption/decryption processes is affected by the randomness of the number produced by random number generator $RNG_A$; in this respect, additional preferred embodiment aspects are detailed below and incorporated into that generator. Lastly, note that while FIG. 2 illustrates encryption/decryption in a path from network element $NE_A$ to network element $NE_B$, one skilled in the art will readily appreciate that the reverse path (i.e., encryption/decryption in a path from network element $NE_B$ to network element $NE_A$) is contemplated as well.

Figure 3:
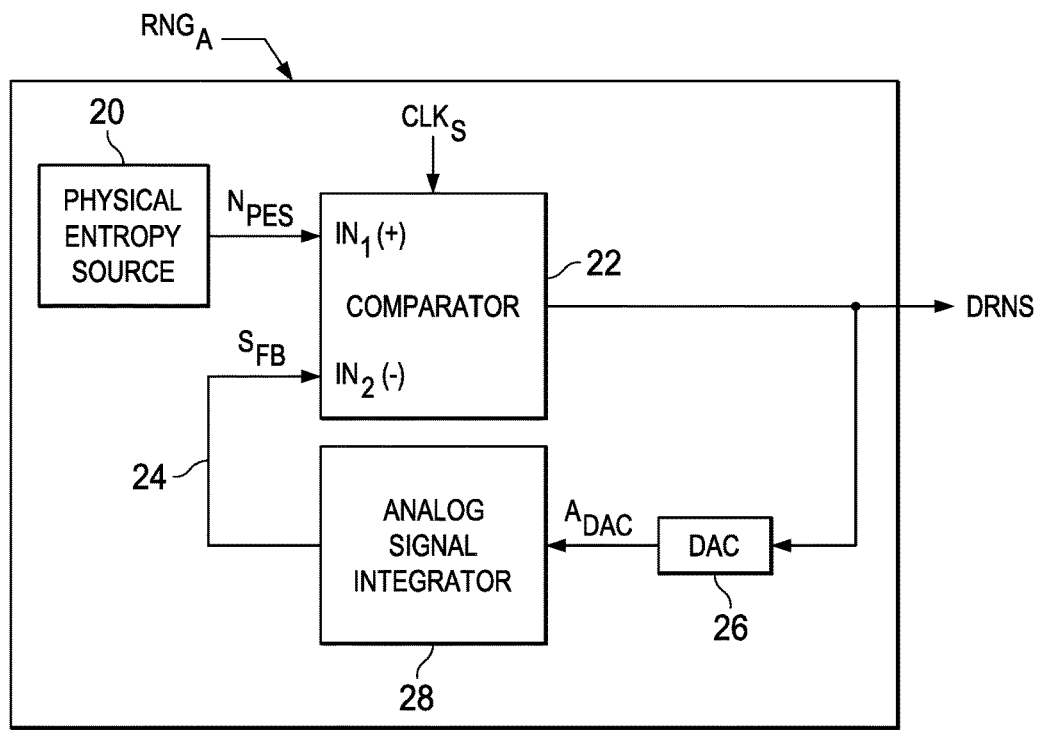
FIG. 3 illustrates a functional block diagram of random number generator $RNG_A$.

FIG. 3 illustrates a functional block diagram of a preferred embodiment random number generator $RNG_A$, with additional schematic representations as to certain aspects provided later. Generator $RNG_A$ includes a physical entropy source 20 that provides an analog noise signal $N_{PES}$, with a randomly fluctuating magnitude. Source 20 may be one of various different forms. For example, source 20 may be thermal noise, which is the electronic noise generated by charge carriers through a conductor; hence, as detailed later, source 20 may be a terminal of a resistor, whereby electronic noise is generated at that terminal by current passing through the resistor (commonly referred to as shot noise). In a practical implementation the voltage fluctuation generated by entropy source 20 will be in order of few microvolts and thereby representing a relatively low input signal swing, as compared, for example, to a typical input signal of an analog-to-digital conversion system.

Random number generator $RNG_A$ also includes a comparator 22, as may be implemented by various forms so as to compare two different signals and provide a digital output of high or low based on the relative amplitude of the compared signals, thereby accomplishing in part an analog-to-digital conversion based on the comparison inputs. In the example of FIG. 3, therefore, comparator 22 has two inputs shown as $IN_1$ and $IN_2$, where input $IN_1$ is connected to receive the analog noise signal $N_{PES}$ from source 20, and input $IN_2$ is connected to receive a feedback analog signal $S_{FB}$ from a limited signal swing node 24, as detailed below. A sample clock $CLK_S$ is also connected to comparator 22, and in response to a same edge (e.g., rising edge) of each cycle of sample clock $CLK_S$, comparator 22 compares $N_{PES}$ at input $IN_1$ to $S_{FB}$ at input $IN_2$ and, as shown in the Figure by the use of (+) and (−) conventions, comparator 22 outputs a binary digital signal (e.g., high) if $N_{PES} > S_{FB}$ or comparator 22 outputs a complementary binary digital signal (e.g., low) if $N_{PES} < S_{FB}$. For successive cycles of the sample clock $CLK_S$, therefore, comparator 22 outputs successive binary values, which in succession thereby in total provide the digital random numeric sequence DRNS, that is, the output of random number generator $RNG_A$. Lastly, note that comparator 22 is shown as comparing a positive and negative input, while in an alternative contemplated preferred embodiment signals $N_{PES}$ and $S_{FB}$ may be input to a differential circuit with the difference output to a single input comparator, where that single input comparator then compares the difference to a reference, again outputting either one of two digital states based on the result of the comparison of the difference to the reference.

The digital random numeric sequence DRNS is both an output of generator $RNG_A$ and is also fed back into a feedback path that eventually provides the feedback analog signal $S_{FB}$ at limited signal swing node 24. In the embodiment of FIG. 3, therefore, the digital random numeric sequence DRNS is connected in the feedback path as an input to a digital-to-analog (DAC) circuit 26. In general, DAC circuit 26 is constructed to convert its digital input to an analog output signal $A_{DAC}$. Such conversion, and structures know to achieve it, are known in the DAC (and ADC) art. As detailed later, in a preferred embodiment, the particular devices chosen to implemented DAC circuit 26 may be relatively simple, given that the precision of the conversion is less critical in that the ultimate output sequence DRNS of $RNG_A$ is a random sequence. In other words, in various other circuit devices, often the precision and corresponding resolution of a DAC is chosen to reduce potential errors in the conversion of data, such as quantization errors; in the preferred embodiment, and by contrast, the introduction of such noise is indeed favorable, as it further randomizes the output signal, which recall is in part driven by the randomness of analog noise signal $N_{PES}$.

The analog output signal $A_{DAC}$ from DAC circuit 26 is input to an analog signal integrator 28. Electrical integrators are known in the circuitry art so as to provide low pass filters and to store some electrical signal representing past signal amplitude averaged over time (i.e., akin to integrating in calculus). In addition, in the art of delta-sigma or sigma-delta modulators, an integrator, or multiple integrators, may be included either in the forward or feedback portion of the entire device signal path so as to shift the noise energy away from the frequency of the modulator input signal, in an effort to reduce the negative performance impact that noise can have on the modulator function. In contrast, however, and as noted with respect to DAC 26, also with respect to integrator 28 the introduction of noise in the signal path that gives rise to the output signal is desirable so as to further randomize the output signal. In this regard, therefore, the quantization noise reduction techniques for DAC resolution or frequency shifting typically associated with modulators teach away from what is implemented in the preferred embodiment which, as shown in various examples below, permits the general function of digital-to-analog and integrative functions to be controlled and timed in a matter that increases, rather than reduces, the presence (or addition) of noise in the signal path.

Also with respect to integrator 28, note that its output is connected to what was introduced above as a limited signal swing node 24. Node 24 is referred to as having a "limited signal swing" for reasons now further defined. Specifically, as known in the circuitry art, various aspects of a circuit, including components and even parameters of conductors, each contribute noise to the overall circuit or system. Under circuit analysis, the collective of such noise can be determined or approximated and referred back to the circuit input, and as such is typically referred to as "input referred noise," that is, the total measure of noise as would affect an input signal. Indeed, in most circuit implementations, additional design is directed toward counterbalancing, or offsetting, the input referred noise, so that the input referred noise does not affect, or has an acceptably low affect, on the intended output signal accuracy of the circuit/system. Indeed, in prior art delta modulators, the step size of the device established to be considerably larger than the input referred noise, where step size is the amount of signal swing that can occur in the feedback path signal during one sample period of the modulator; this design criteria allows the signal swing in a clock cycle to dominate over any noise, so as to allow the modulator to properly track or approximate the modulator forward path input signal. In contrast, in the preferred embodiment and returning to node 24, it is termed a "limited signal swing" in that either or both of DAC 26 and integrator 28 are established so as to limit the signal swing at node 24 to be equal to or less than the RMS value of the input referred noise of generator $RNG_A$, where that noise includes any noise effects from devices 20, 22, 26, 28, and the interconnects between them. As a result, as noise affects the system, node 24 is intentionally designed so swing, during any period of $CLK_S$, a limited amount so that the noise is actually able to dominate the signal at node 24, rather than just the opposite as would be the case in the prior art. In other words, noise is used to accomplish a greater randomness in the feedback path, thereby allowing such randomness to further be represented in the ultimate output sequence DRNS. For example, in a preferred embodiment, the range (e.g., between the points of three standard deviations from the center of a Gaussian distribution) of input referred noise is generally known or ascertainable, where for sake of an example, consistent with a schematic provided later, assume that such a range is between −100 µvolts and +100 µvolts. Thus, the total signal swing within this input signal range is 200 µvolts. By way of example, assume at one instant of time the value of $N_{PES}$ is 'x(0)' and the value of $S_{FB}$ is 'y(0)'.

Comparator 22 produces an output based on x(0) and y(0). Let us assume x(0)>y(0) and so comparator 22 produces an output of 'high'. When this 'high' is integrated in integrator 28 it raises the voltage on $S_{FB}$ (i.e., at node 24) to a new value 'y(1)'. Now when comparator 22 triggers the next time in response to clock $CLK_S$, the input random noise value changes to x(1) and comparator 22 makes a new decision based on x(1) and y(1). As the system is in negative feedback the integrator 28 output $S_{FB}$ always attempts to reach the input signal $N_{PES}$. Comparator 22 digitizes the residual error signal (x(t)-y(t)). We know x(t) is a true random signal. So as long as x(t) is comparable to y(t), the difference will be random and digital equivalent of it (DRNS) will be also be random.

FIG. 4 again illustrates a functional block diagram of random number generator $RNG_A$, with additional schematic representations now shown in certain blocks. Looking first to physical entropy source 20, in one preferred embodiment it is formed by a resistor divider that includes a resistor R1 in series with a resistor R2, with the series resistance connected between a fixed voltage source VDD and ground. In a preferred embodiment, the resistance of resistors R1 and R2 are equal, but alternative resistances may be used. In any event, given the potential across the resistor pair, a current flows, and a node $20_N$ between the resistors provides an output signal. In general, the voltage at node $20_N$ could be expected as fixed at a DC level, fixed DC voltage, but in a more detailed analysis it is known that current flow through a conductor gives rise to analog noise signal in addition to the DC level that occurs due to the voltage division as between the resistors. As with the example cited earlier in the document, VDD and the resistances of resistors R1 and R2 are preferably selected so that the analog fluctuation or noise swings between approximately −100 µvolts and +100 µvolts. Notably, such an input value would typically be far below the resolution of a standard prior art delta modulator, so as not to be sufficient to cause a transition in such a device. In high performance ADC, however, this value may be possible to quantize. Unfortunately a high performance ADC will be a very cost inefficient way to generate the DRNS. In high performance ADC, major effort is spent in reducing the negative impact of noise and ensuring that the ADC output digital code is only dependent on input signal. However, in a preferred embodiment, the output digital code does not have to follow the input signal, rather output digital code should be as random as possible. Thus, in the preferred embodiment, additional implementation details permit a truly randomized output in a very cost effective manner. More particularly, with resistor R1 and R2 equal to approximately 2 MΩ, current flowing through the series connections generates an RMS noise voltage of approximately 180 nVk/√Hz. This fluctuation component of the voltage signal provides the above-introduced analog noise signal $N_{PES}$, further responded to as detailed below.

Figure 4:
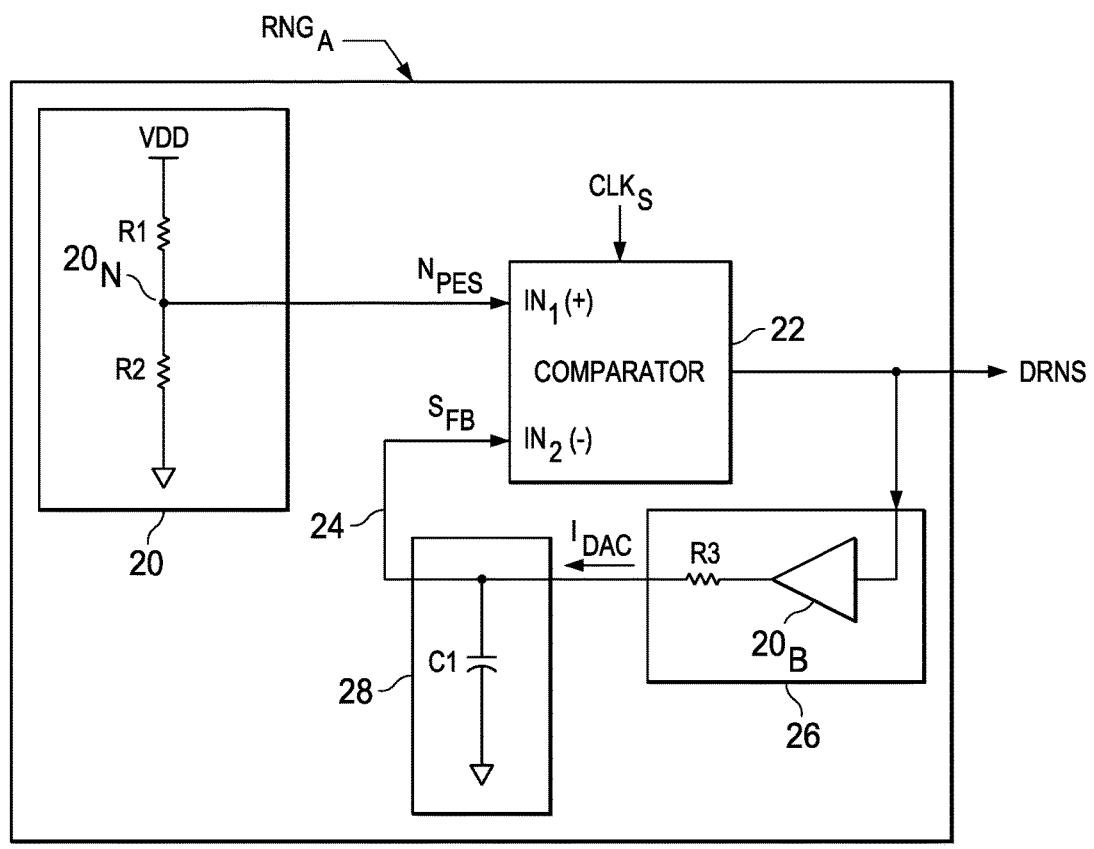
FIG. 4 illustrates a functional block diagram of random number generator $RNG_A$, with additional schematic representations now shown in certain blocks.

Comparator 22 is not detailed in FIG. 4 as it may be readily constructed according to principles ascertainable to one skilled in the art, particularly given the context of the teachings of this document. For example, each of inputs $IN_1$ and $IN_2$ may be connected to a respective transistor gate in a differential pair of connected transistors, whereby one or the other of the transistors is enabled at a time based on the relative potentials at those inputs and the result is gated by the frequency of sample clock $CLK_S$. Also in this regard, note that in a preferred embodiment, the frequency of sample clock $CLK_S$ is less than the frequency bandwidth of the input signal, as again the preferred embodiment endeavors to further randomize the input rather than to model it with a digital value that tracks it. For example, the bandwidth of $N_{PES}$ might be 1 MHz, while sample clock CLK is 1 kHz, such that there is one or more orders of magnitude between the two (e.g., three orders of magnitude as between 1 MHz and 1 kHz, whereas two orders of magnitude may suffice in some preferred embodiments). Moreover, amplifier circuitry may be included in comparator 22, for example so as to reduce input offset. Additional circuitry may be included so as to ensure that, in response to the differential input, the output is either fully high or fully low, so as to provide a digital output signal (i.e., logic high or logic low). Further, the digital signal is driven to amplitudes for other circuitry using the sequence, as for example use in connection with cryptography as described earlier. In this regard, therefore, a typical logic high voltage may be 1.0 volt, for example. As introduced earlier, therefore, the digital output is therefore a single binary value at a time, which over successive values provides digital random numeric sequence DRNS. Indeed, note further that for a relatively small input signal with an order of magnitude of 100 μvolts, a considerable dynamic range is realized in the output of 1 volt. This may be contrasted, by way of example, to costly and complex prior art modulators where the output signal amplitude has a high correlation to the amplitude of the input signal.

FIG. 4 further illustrates schematic details for one preferred embodiment of DAC circuit 26. Particularly, DAC circuit 26 may be in effect a single bit circuit, that is, having only a resolution of $2^1=2$ states, including an analog buffer $26_B$ that receives the digital output from comparator 22 and, in response, outputs an analog voltage signal. For simplicity in this preferred embodiment, it is assumed as a rail signal of either a high rail analog signal or a low rail analog signal, based on a respective digital input of 1 or 0. The output of buffer $26_B$ is connected through a resistor R3, which from the analog voltage of buffer $26_B$ causes a current $I_{DAC}$ to flow. This current is provided to integrator 24.

FIG. 4 further illustrates schematic details for one preferred embodiment of analog signal integrator 28. Particularly, integrator 28 may elegantly and without complexity include a single capacitor C1, thereby minimizing design considerations such as area and power consumed by the device. In such an implementation, current $I_{DAC}$ is connected to limited signal swing node 24, and capacitor C1 is connected between node 24 and ground. In all events, note therefore that the combination of capacitor C1 and resistor R3 (of DAC circuit 26) provide a low power consuming RC network with time constant that will control the charge/discharge rate at node 24. In a preferred embodiment, therefore, the respective capacitance and resistance values of these devices is selected, in combination with the frequency of sample clock $CLK_S$, so as to limit what was introduced above as the step size at node 24, that is, the amount of voltage swing that can occur at node 24 during any single period of sample clock $CLK_S$. For example, with resistor R3 equal to 2 MΩ and capacitor C1 equal to 50 pF, then for $CLK_S$=50 MHz the step size at node $24_N$ is 150 μvolts. This step size may be considered an effective resolution of the combination of DAC 26 and integrator 28, that is, the amount of voltage change that may be represented in a single cycle of sample clock $CLK_S$. Importantly, therefore, note that this combination does have a very high resolution as would be expected in a prior art delta modulator that endeavors to accurately quantize considerably larger input analog signals while effectively reducing (or shifting to a different frequency) quantization noise, while in contrast the preferred embodiment need not accurately quantize a large (or any) input, but instead is dithering the DAC 26 voltage with the already-random input signal (e.g., thermal noise) from source 20, so as to produce further randomization into the eventual RNG output signal, DRNS. Thus, the charge stored at node 24 (by capacitor C1) will be in some sense related to previous output signals as fed back, but the step size at that node is less than potential swings in $N_{PES}$; thus, for a given cycle of sample clock $CLK_S$, the amount of signal swing input to input $IN_1$ of comparator 22 can exceed the limited step size at input $IN_2$ (i.e., from node 24), whereby an accurate analog-to-digital conversion is not achieved, but instead the already-randomized input is further randomized by a feedback signal that is influenced by, but not equal to, a previous output and fed back signal.

Figure 5:
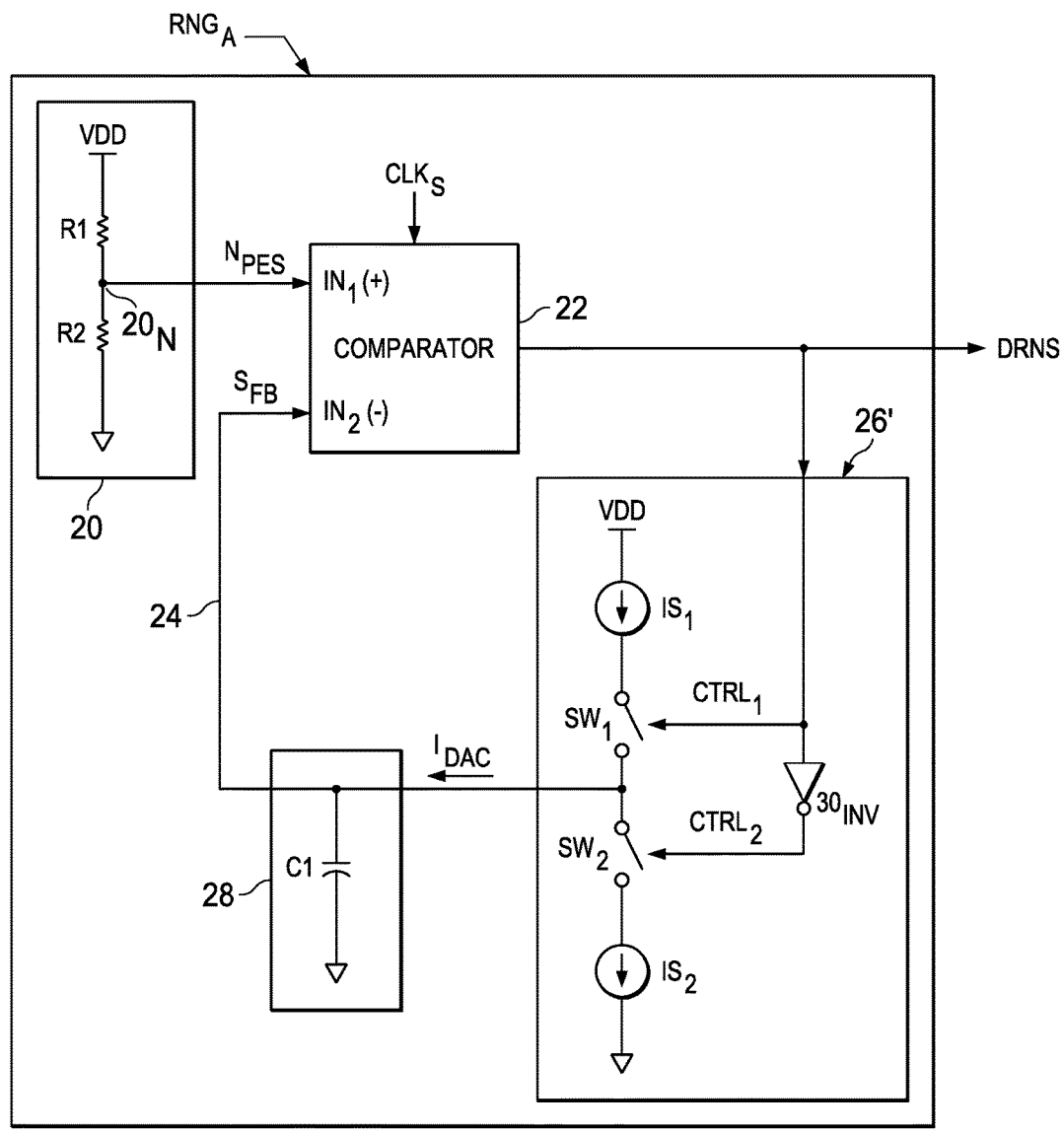
FIG. 5 illustrates a functional block diagram of random number generator $RNG_A$, with additional schematic representations shown for a DAC circuit 26' as an alternative to DAC circuit 26 shown in FIG. 4.

FIG. 5 again illustrates a functional block diagram of random number generator $RNG_A$, with additional schematic representations shown for a DAC circuit 26' as an alternative to DAC circuit 26 shown in FIG. 3. In Figure, DAC 26' again receives the binary output signal from comparator 22, and that signal provides a control signal $CTRL_1$ to a switch $SW_1$, and it also is connected through an inverter $30_{INV}$ which, therefore, outputs provide a control signal $CTRL_2$ to a switch $SW_2$. As detailed below, the illustration of each switch $SW_x$ is intended to depict that the switch is closed when its respective control signal is high, while the switch is open when its respective control signal is low. In more detail, a first current source $IS_1$ is connected from VDD to the pole of switch $S_1$, and the throw of switch $S_1$ is connected to node 24. The pole of switch $S_2$ is connected to node 24, while a second current source $IS_2$ is connected from the throw of switch $S_2$ to ground. Given the above-noted intended control, therefore, when the output of comparator 22 is a binary high value, switch $SW_1$ closes and switch $SW_2$ opens, so that current source $IS_1$ charges node $24_N$. In opposite fashion, when the output of comparator 22 is a binary low value, switch $SW_1$ opens and switch $SW_2$ closes, so that current source $IS_2$ sinks charge from node $24_N$. Given this operation, one skilled in the art will appreciate that the capacitance of capacitor C1, connected to node 24, may be selected again so as to limit the step size, per clock period of $CLK_S$, of voltage swing at node $24_N$, consistent with the teachings of this document for further randomizing the signal path of generator $RNG_A$.

Figure 6:
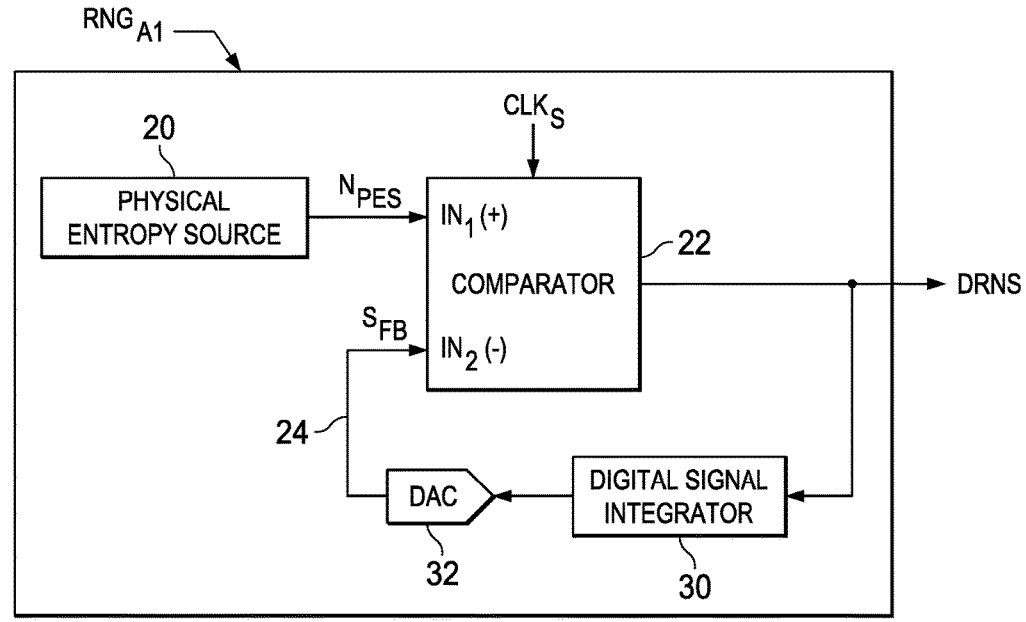
FIG. 6 again illustrates a functional block diagram of an alternative random number generator $RNG_{A1}$ relative to that of FIG. 3, with the alternative presenting a reversal of the order of devices in the feedback path.

FIG. 6 again illustrates a functional block diagram of an alternative random number generator $RNG_{A1}$ relative to that of FIG. 3, with the alternative presenting a reversal of the order of devices in the feedback path. Given the earlier discussion of the approach of FIG. 3, one skilled in the art should readily appreciate most of the details of FIG. 6 so a shorter description is now provided. In random number generator $RNG_{A1}$, the output of comparator 22 is connected as an input to a digital signal integrator 30. The output of digital signal integrator 30 is preferably a multibit digital signal that is connected as an input to a DAC 32, which provides an output to node 24 and thereby again provides the limited signal swing that is connected to the negative input of comparator 22.

In operation, digital integrator 30 can be understood as a counter that increments when the output of comparator 22 is "high" and decrements when the output of comparator 22 is "low." The number of bits in integrator 30 is matched with the resolution of DAC 32. DAC 32 is a multibit DAC that converts the output of digital integrator 30 into an analog signal. The least significant bit (LSB) size of DAC 32 is again chosen so as to limit the voltage swing at node 24 for a given cycle of clock CLKS, that is, to be equal to or less than the RMS value of the input referred noise at the positive input to comparator 22. The maximum and minimum values of DAC are designed to include several (e.g., three) standard deviations of the RMS input referred noise input to comparator 22.

Figure 7:
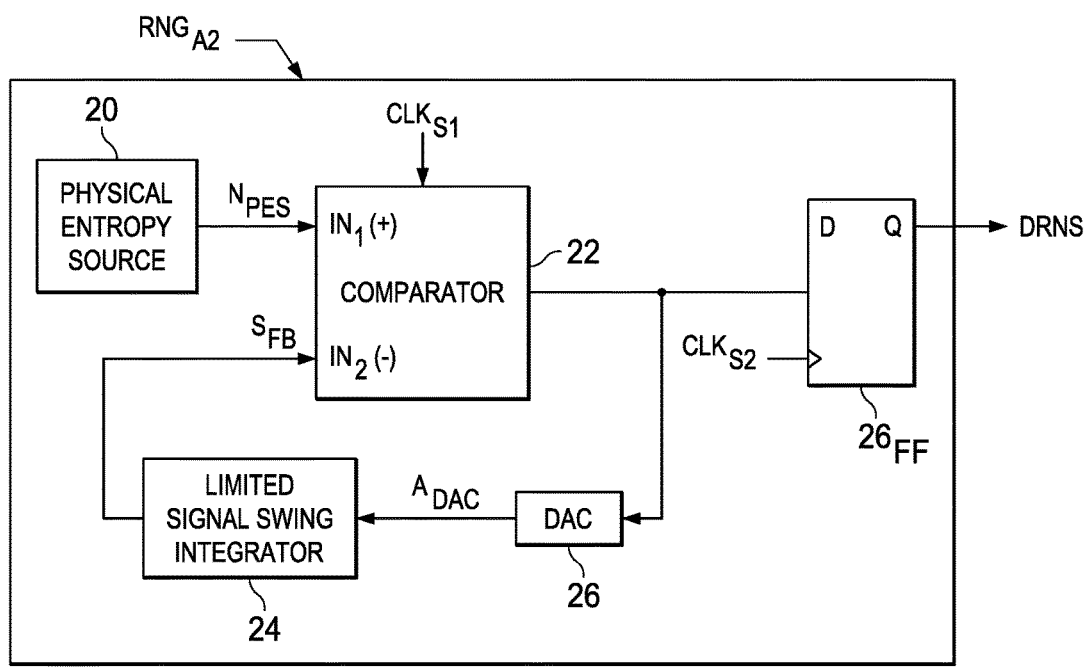
FIG. 7 again illustrates a functional block diagram of an alternative random number generator $RNG_{A2}$ relative to that of FIG. 3, with the alternative presenting a different clocking arrangement and a flip flop $26_{FF}$.

FIG. 7 illustrates a functional block diagram of an alternative random number generator $RNG_{42}$ relative to that of FIG. 3, with the alternative presenting a different clocking arrangement and a flip flop 26. Specifically, in FIG. 7, the clock signal to comparator 22 is shown as a first sample clock $CLK_{S1}$, while a second sample clock $CLK_{S2}$, operating at a frequency differing and preferably slower than, $CLK_{S1}$, clocks a flip flop $26_{FF}$ that has its data input connected to the output of comparator 22, while the output of flip flop $26_{FF}$ provides the digital random numeric sequence DRNS. With respect to further detail of first sample clock $CLK_{S1}$, it is recognized in connection with the inventive scope that comparators are typically operable to perform a comparison at a speed that is faster than is specified, or alternatively for additional design operational assurance a comparator is typically clocked by a system clock at a frequency slower than the actual comparative speed of the device. In this regard, a comparator such as comparator 22 may include internal signaling to indicate when each comparison it achieves is complete, while the overall system is synchronized to a system clock. In a preferred embodiment of random number generator $RNG_{42}$, therefore, the internal signaling of comparator 22 is used to trigger first sample clock $CLK_{S1}$, that is, the output of comparator 22 is sampled as soon as the comparison function of comparator 22 is complete. At this point, therefore, that output is immediately input to DAC 26 and further processed in the feedback path as described earlier. At a slower rate, however, and preferably also therefore asynchronous to the clocking of comparator 22, flip flop $26_{FF}$ is clocked by sample clock $CLKS_2$, which itself can be implemented as the system clock. Given the relative speeds of sample clocks $CLKS_1$ and $CLKS_2$, and further in view of the lack of synchronization between the two, additional randomness is therefore imparted as between the feedback path and ultimate output value for generator $RNG_{42}$, as compared to preferred embodiments described above.

Given the preceding, the preferred embodiments provide a computation system for creating a digital entropy signal. The preferred embodiments provide numerous benefits. For example, the preferred embodiments include a robust random signal available to preferred embodiment or other circuits, systems, and processes, such as for securing data through encryption or the like. As another example, the preferred embodiments are relatively straightforward to implement and accomplish a desirable random signal with relative low cost and low power consumption. These results are achievable despite the otherwise difficulty in the art of achieving metastability in faster device nodes. As still another example, a preferred embodiment may include the teachings herein with additional functionality integrated into a whole, such as a system level processor, including a microprocessor, DSP, or MCU. Still further, the preferred embodiments have been to include numerous variations and still others are contemplated or may be ascertained by one skilled in the art. For example, the preferred embodiment has been shown with a signal path that includes a feed forward path and a feedback path, with analog-to-digital (e.g., comparator) and digital-to-analog conversion in those paths, along with a controlled node so as introduce additional randomness into the conversion of the data in the signal path. While particular examples have been shown of location of these aspects along the path, various aspects may be re-ordered or located in different locations of the total signal path thereby producing still other preferred embodiments. Thus, from the above, therefore, one skilled in the art should further appreciate that while some embodiments have been described in detail, various substitutions, modifications or alterations can be made to the descriptions set forth above without departing from the inventive scope, as is defined by the following claims.

What is claimed is:

1. An electronic circuit system, comprising:
   a resistor divider having a voltage source node, a ground terminal node, and divider node;
   an analog-to-digital converter (ADC) having a first input coupled to the divider node in the resistor divider, a second input, and an output;
   a digital-to-analog converter (DAC) circuit having an input coupled to the output of the ADC and an output; and
   an integrator having an input coupled to the output of the DAC, and an output coupled to the second input of the ADC.

2. The system of claim 1 wherein a signal swing at the second input of the integrator is responsive to the output of the integrator.

3. The system of claim 1 wherein the integrator includes a capacitor coupled between the second input of the ADC and the ground terminal.

4. The system of claim 3 wherein the DAC includes a resistor coupled between the output of the DAC and the second input of the ADC.

5. The system of claim 1 wherein the DAC includes a resistor coupled between the output of the DAC and the second input of the ADC.

6. The system of claim 1 wherein the ADC comprises a comparator.

7. The system of claim 6 wherein the comparator is operable to perform a compare operation in response to each period of a clock period.

8. The system of claim 1 further comprising processor circuitry, the processor circuitry operable to perform functionality in response to changes in a digital output value.

9. The system of claim 8 wherein the functionality comprises data encryption.

* * * * *